(12) United States Patent
Shuto

(10) Patent No.: US 8,129,766 B2
(45) Date of Patent: Mar. 6, 2012

(54) SEMICONDUCTOR MEMORY DEVICE COMPRISING SHIFTED CONTACT PLUGS

(75) Inventor: Susumu Shuto, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 106 days.

(21) Appl. No.: 12/563,006

(22) Filed: Sep. 18, 2009

(65) Prior Publication Data

US 2011/0018043 A1 Jan. 27, 2011

(30) Foreign Application Priority Data

Jul. 22, 2009 (JP) ................................. 2009-171040

(51) Int. Cl.
*H01L 21/02* (2006.01)

(52) U.S. Cl. ........ 257/295; 257/532; 257/535; 257/758; 257/E23.142; 257/E23.144; 257/E23.145; 257/E21.663; 257/E27.104; 365/65; 365/145

(58) Field of Classification Search .......... 257/E27.104, 257/758, E23.142, E23.144, E23.145, 532, 257/535, 295, E21.663; 365/65, 145
See application file for complete search history.

(56) References Cited

U.S. PATENT DOCUMENTS

| 5,903,492 | A | 5/1999 | Takashima | |
|---|---|---|---|---|
| 7,755,077 | B2 * | 7/2010 | Inaba | 257/5 |
| 2002/0031885 | A1 * | 3/2002 | Takashima | 438/240 |
| 2004/0195601 | A1 * | 10/2004 | Kumura et al. | 257/295 |

FOREIGN PATENT DOCUMENTS

| JP | 2002-094017 A | 3/2002 |
|---|---|---|
| JP | 2008-277514 A | 11/2008 |
| JP | 2008-300376 A | 12/2008 |

* cited by examiner

OTHER PUBLICATIONS

Explanation of Non-English Language References.

*Primary Examiner* — Matthew E Warren
*Assistant Examiner* — David Chen
(74) *Attorney, Agent, or Firm* — Knobbe, Martens, Olson & Bear LLP

(57) ABSTRACT

A memory includes first contact plugs; ferroelectric capacitors above the first contact plugs; second contact plugs in a first interlayer film being below an area which is between two adjacent ferroelectric capacitors, the second contact plug; first interconnections connected to the second contact plugs, the first interconnections extending in a first direction substantially perpendicular to an arrangement direction, in which the two ferroelectric capacitors are arranged, on the first interlayer film; a second interlayer film above the first interlayer film and the first interconnection; third contact plugs in the second interlayer film, the third contact plugs being respectively connected to the first interconnections at positions shifted from the second contact plugs in the first direction; and second interconnections electrically connecting the third contact plug to the upper electrodes of the two ferroelectric capacitors.

6 Claims, 10 Drawing Sheets

SEMICONDUCTOR MEMORY DEVICE COMPRISING SHIFTED CONTACT PLUGS

CROSS-REFERENCE TO RELATED APPLICATION

This application is based upon and claims the benefit of priority from the prior Japanese Patent Application No. 2009-171040, filed on Jul. 22, 2009, the entire contents of which are incorporated herein by reference.

BACKGROUND OF THE INVENTION

1. Field of the Invention

The present invention relates to a semiconductor memory device.

2. Related Art

FeRAMs (Ferro-electric Random Access Memories) utilizing ferroelectric capacitors have attracted attention as one of non-volatile semiconductor memories. Recently, reduction in chip size has been demanded in the ferroelectric random access memories to reduce manufacturing costs. To reduce the chip size, it is effective to reduce a unit cell size.

For example, when a contact is provided between two adjacent ferroelectric capacitors, a distance between the two ferroelectric capacitors must be set to be large to a certain extent to prevent a short circuit between the ferroelectric capacitor and the contact. Meanwhile, when the area of the ferroelectric capacitor is reduced, a signal difference (a read voltage difference between data "1" and data "0") may be reduced.

SUMMARY OF THE INVENTION

A semiconductor memory device according to an embodiment of the present invention comprises: a plurality of transistors on a semiconductor substrate; a first interlayer dielectric film covering the transistors; a plurality of first contact plugs in the first interlayer dielectric film, each first contact plugs being connected to one of diffusion layers of one of the transistor; a plurality of ferroelectric capacitors above the first contact plugs, each ferroelectric capacitor comprising a lower electrode, a ferroelectric film, and an upper electrode; a plurality of second contact plugs in the first interlayer dielectric film, each second contact plug being below an area which is between two adjacent ferroelectric capacitors and being connected to the other of diffusion layers of one of the transistor; a plurality of first interconnections connected to the second contact plugs, the first interconnections extending in a first direction substantially perpendicular to an arrangement direction, in which the two ferroelectric capacitors are arranged, on the first interlayer dielectric film; a second interlayer dielectric film above the first interlayer dielectric film and the first interconnection; a plurality of third contact plugs in the second interlayer dielectric film, the third contact plugs being respectively connected to the first interconnections at positions shifted from the second contact plugs in the first direction; and a plurality of second interconnections electrically connecting the third contact plug to the upper electrodes of the two ferroelectric capacitors.

DETAILED DESCRIPTION OF THE INVENTION

Embodiments of the present invention will be explained below in detail with reference to the accompanying drawings. Note that the invention is not limited thereto.

First Embodiment

Figure 1:
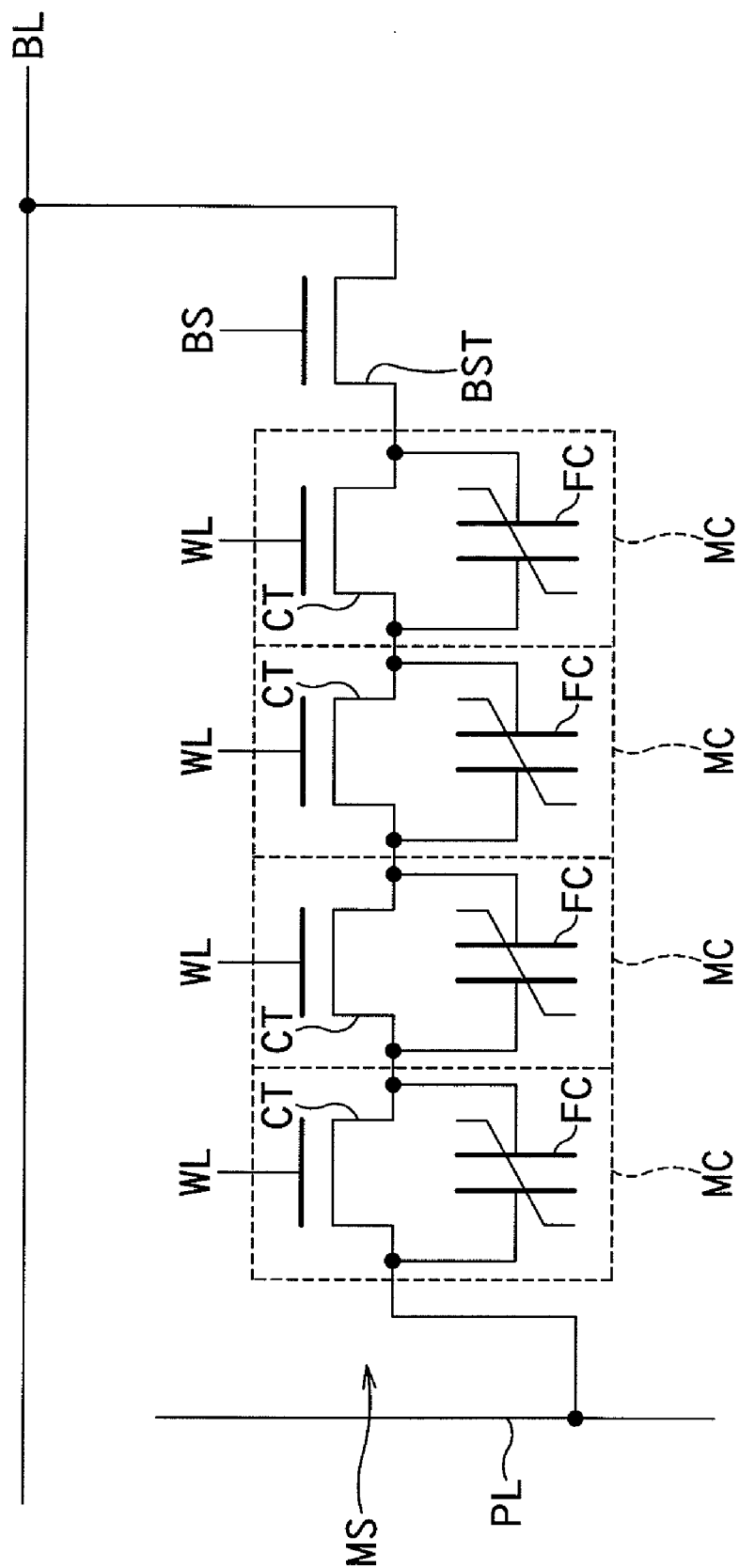
FIG. 1 is a circuit diagram showing a configuration of a ferroelectric memory according to a first embodiment of the present invention.

FIG. 1 is a circuit diagram showing a configuration of a ferroelectric memory according to a first embodiment of the present invention. The ferroelectric memory according to the first embodiment can be a "Series connected TC unit type ferroelectric RAM" which is a memory consisting of series connected memory cells each having a transistor having a source terminal and a drain terminal and a ferroelectric capacitor inbetween said two terminals.

The ferroelectric memory according to the first embodiment comprises a plurality of the word lines WL extending in a row direction, a plurality of bit lines BL extending in a column direction perpendicular to the row direction, a plurality of plate lines PL extending in the row direction, and a block selective transistor BST.

The memory cell MC is configured to store data in its ferroelectric capacitor. The memory cell MC is provided at the intersection of the word line WL with the bit line BL. Each of the word line WL is connected to gates of the cell transistors CT arranged in the row direction or functions as a gate. Each of the bit line BL is connected to sources or drains of the cell transistors CT arranged in the column direction.

The ferroelectric memory comprises a plurality of memory strings MS each of which is configured by serially connecting a plurality of memory cells MC each of which includes a ferroelectric capacitor FC and the cell transistor CT connected to each other in parallel. Only one memory string MS is shown in FIG. 1. One end of the memory string MS is connected to one end of the block selective transistor BST. The other end of the memory string MS is connected to the plate line PL. The other end of the block selective transistor BST is connected to the bit line BL. That is, the bit line BL is connected via the block selective transistor BST to the memory string MS.

Figure 2:
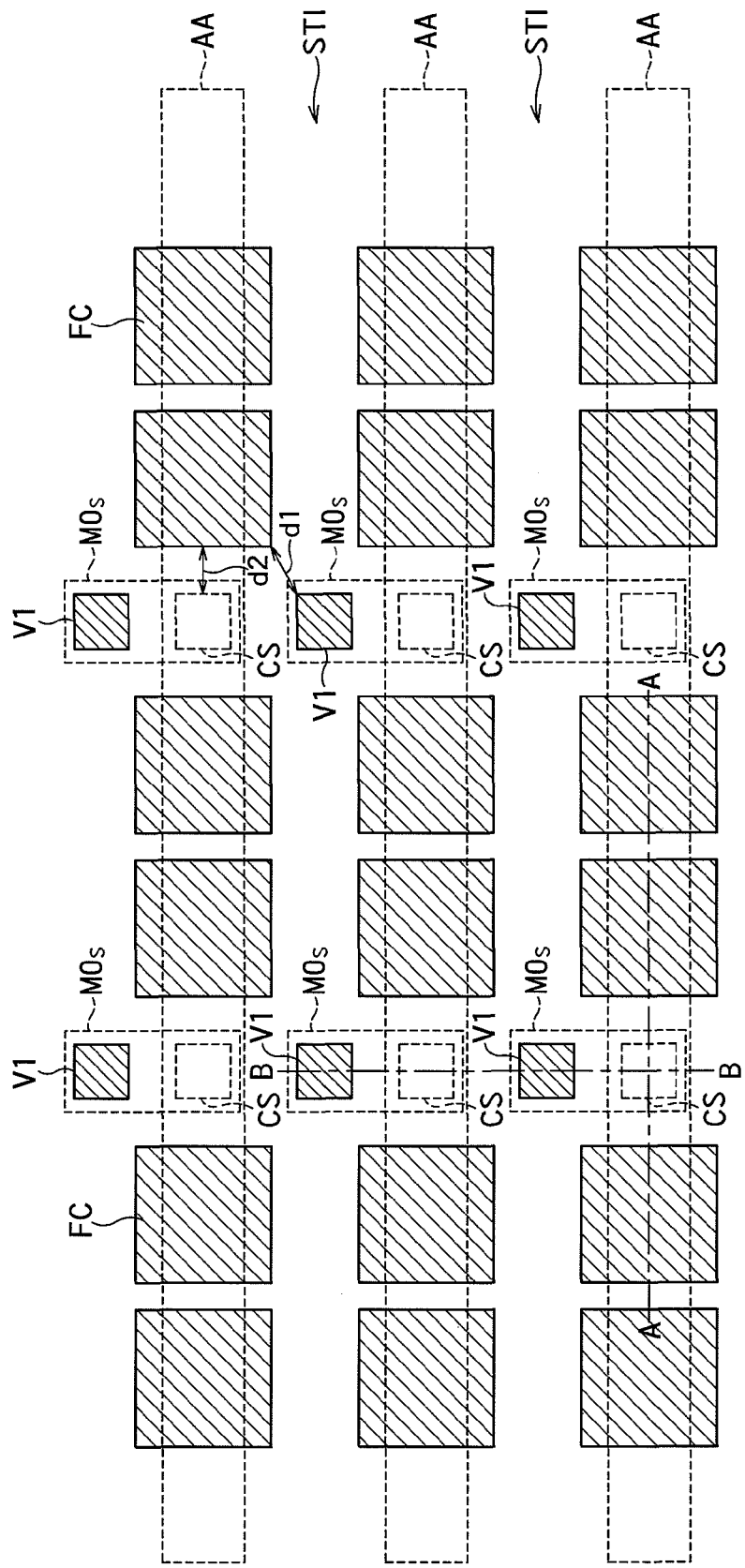
FIG. 2 is a plan view showing an arrangement of the ferroelectric capacitors FC and contact plugs V1.
Figures 3A, 3B:
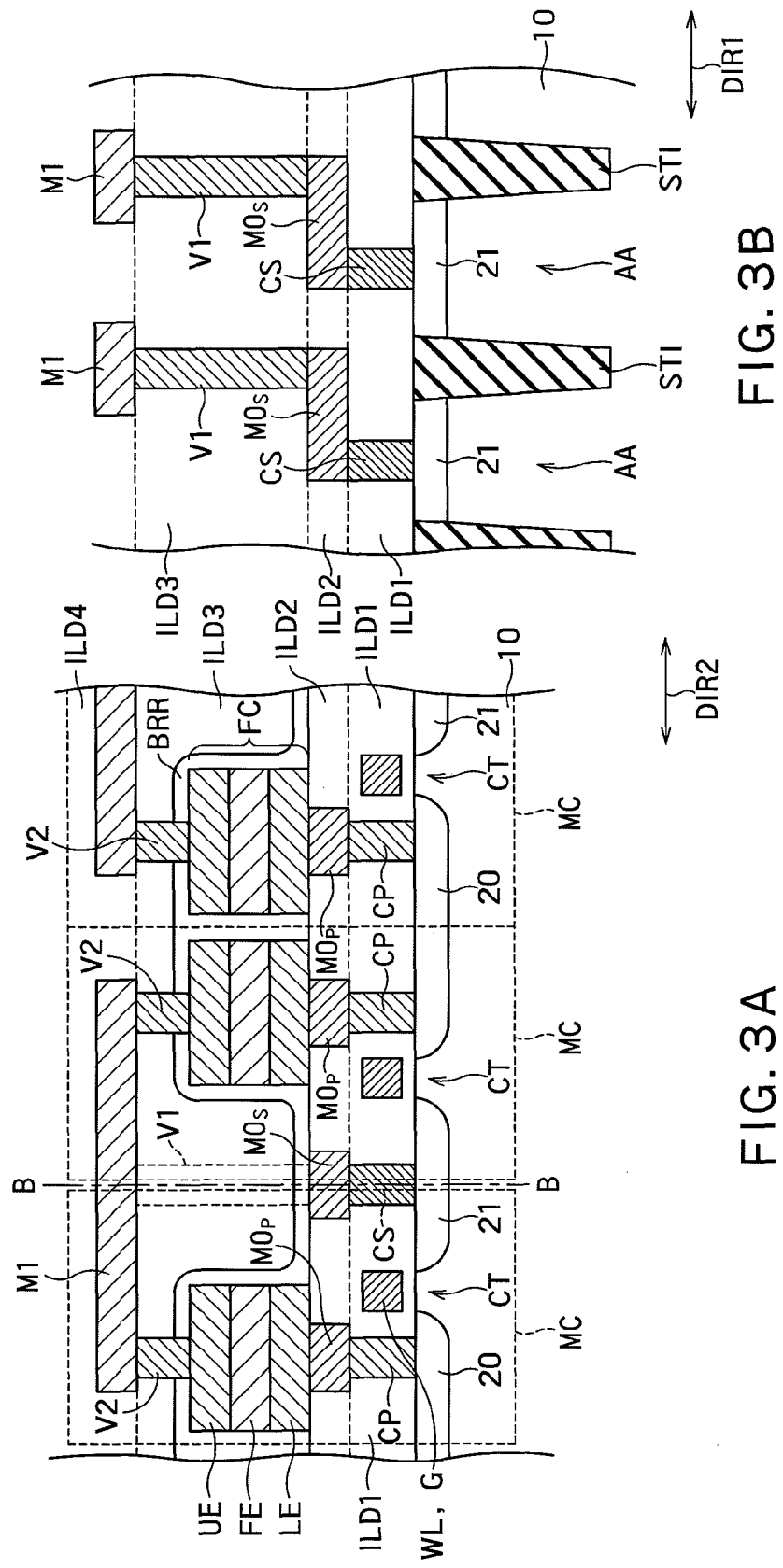
FIGS. 3A and 3B are cross-sectional views along lines A-A and B-B shown in FIG. 2, respectively.

FIG. 2 is a plan view showing an arrangement of the ferroelectric capacitors FC and contact plugs V1. FIGS. 3A and 3B are cross-sectional views along lines A-A and B-B shown in FIG. 2, respectively.

As shown in FIG. 2, a plurality of active areas AA are formed on a surface of a semiconductor substrate in straight stripes. A shallow trench isolation STI is provided between two adjacent active areas AA which are arranged in a striped pattern.

The ferroelectric capacitors FC are arranged two-dimensionally in a matrix above the active areas AA. The contact plug V1 is provided not above the active area AA but above the shallow trench isolation STI.

A plurality of the cell transistors CT are provided on the active area AA of a silicon substrate 10 as shown in FIG. 3A. The cell transistor CT comprises a gate electrode G functioning as the word line WL and source/drain diffusion layers 20 and 21. The gate electrode G extends in a first direction substantially perpendicular to a direction that the active area AA extends (column direction) on the silicon substrate 10 (that is, in a direction vertical to the plane of FIG. 3A (row direction)). The first direction is substantially perpendicular to a direction that the ferroelectric capacitors FC are arranged on a certain active area AA on a first interlayer dielectric film ILD1 (that is, a direction from the active area AA to the shallow trench isolation STI). The first interlayer dielectric film ILD1 is provided so as to cover the cell transistors CT. The diffusion layers 20 and 21 are provided alternately on the active area AA. Two adjacent cell transistors CT share the diffusion layer 20 or 21.

A first contact plug CP and a second contact plug CS are provided in the first interlayer dielectric film ILD1. The first contact plug CP is connected to the diffusion layer 20 serving as either the source or the drain. The second contact plug CS is connected to the diffusion layer 21 serving as the other of the source and the drain.

First metallic interconnections M0p and M0s are formed on the first and second contact plugs CP and CS. The first metallic interconnection on the first contact plug CP is indicated by M0p. The first metallic interconnection on the second contact plug CS is indicated by M0s. M0p and M0s are formed by patterning the same metallic interconnection layer.

The first metallic interconnections M0p and M0s serve as an etching stopper when a contact hole for the third contact plug V1 is formed. Because the contact hole of the third contact plug V1 is deep, a large amount of over-etching is required. Thus, the first metallic interconnections M0p and M0s are required to protect the first interlayer dielectric film ILD1 and the silicon substrate 10.

With reference to FIG. 3B, the first metallic interconnection M0s on the second contact plug CS is formed so as to be connected to a top surface of the second contact plug CS and extend in a first direction DIR1. The first metallic interconnection M0s extends over the active area AA to reach above the shallow trench isolation STI. The first metallic interconnection M0p does not extend above the shallow trench isolation STI and is provided in the active area AA.

As shown in FIG. 3A, an interlayer dielectric film ILD2 is formed on the first interlayer dielectric film ILD1 to the top surface level of the first metallic interconnections M0p and M0s. The ferroelectric capacitor FC is formed on the interlayer dielectric film ILD2 and the first metallic interconnection M0p on the first contact plug CP. That is, the ferroelectric capacitor FC is formed above the first contact plug CP and the first interlayer dielectric film ILD1. The ferroelectric capacitor FC comprises a lower electrode LE, an upper electrode UE, and a ferroelectric film FE between the lower electrode LE and the upper electrode UE.

The second contact plug CS is formed in the first interlayer dielectric film ILD1 below and between two adjacent ferroelectric capacitors FC in the direction that the active area AA extends.

A hydrogen barrier film BRR covers a side surface of the ferroelectric capacitor FC. The hydrogen barrier film BRR is for preventing hydrogen from external from reaching the ferroelectric capacitor FC. The hydrogen barrier film BRR is made of $Al_2O_3$, $TiO_2$, $ZrO_2$, or SiN, for example.

An interlayer dielectric film ILD3 is provided above the first interlayer dielectric film ILD1, the first metallic interconnection M0s, and the ferroelectric capacitor FC so as to cover the hydrogen barrier film BRR. Either the interlayer dielectric film ILD2 or ILD3 or both of them will be called a second interlayer dielectric film.

The third contact plug V1 is formed in the interlayer dielectric film ILD3 as shown in FIG. 3B. The third contact plug V1 is connected to the first metallic interconnection M0s at a position shifted from the second contact plug CS in the first direction DIR1. That is, one end of the first metallic interconnection M0s is connected to the second contact plug CS and the other end thereof is connected to the third contact plug V1. The third contact plug V1 is connected to the end of the first metallic interconnection M0s extending from the active area AA toward the shallow trench isolation STI and formed above the shallow trench isolation STI.

A fourth contact plug V2 is formed on the upper electrode UE as shown in FIG. 3A.

A metallic interconnection M1 (local interconnection) is provided so as to connect the third contact plug V1 to two fourth contact plugs V2 on sides of the third contact plug V1. Thus, the third contact plug V1 is electrically connected via the fourth contact plug V2 to the upper electrode UE.

The diffusion layer 21 is electrically connected via the second contact plug CS, the first metallic interconnection M0s, the third contact plug V1, the second metallic interconnection M1, and the fourth contact plug V2 to the upper electrode UE. The diffusion layer 20 is electrically connected via the first contact plug CP and the first metallic interconnection M0p to the lower electrode LE. Thus, the ferroelectric capacitor FC and the cell transistor CT in the memory cell MC are connected to each other in parallel.

Upper electrodes UE of two ferroelectric capacitors FC on the sides of the second contact plug CS are connected to each other by the second metallic interconnection M1 (local interconnection). The diffusion layer 20 electrically connects lower electrodes LE of two ferroelectric capacitors FC on one side of the second contact plug CS. The memory cells MC in the active area AA are thus serially connected. As a result, the memory string MS shown in FIG. 1 is formed.

According to the first embodiment, the first metallic interconnection M0s extends above the shallow trench isolation STI and the third contact plug V1 is provided above the shallow trench isolation STI as shown in FIGS. 3B and 2. Because the active area AA, the second contact plug CS, and the first metallic interconnection M0s are provided below the third contact plug V1, the active area AA, the second contact plug CS, and the first metallic interconnection M0s are shown by broken lines in FIG. 2.

As shown in FIG. 2, the third contact plug V1 is at the intermediate position between two adjacent active areas AA. Further, the third contact plug V1 is disposed at a position with a substantially equal distance from four neighbor ferroelectric capacitors. Because the third contact plug V1 is provided above the shallow trench isolation STI, a distance d1 between the third contact plug V1 and the ferroelectric capacitor FC can be more increased than conventional cases.

The contact plug V1 is conventionally provided on the contact plug CS. Thus, the distance between the contact plug V1 and the ferroelectric capacitor FC is d2.

In contrast, the third contact plug V1 is provided above the shallow trench isolation STI in the first embodiment. Thus, the distance between the third contact plug V1 and the ferroelectric capacitor FC is d1 (>d2). Accordingly, a short circuit between the third contact plug V1 and the ferroelectric capacitor FC can be avoided and the yield and M0 of the ferroelectric memory can be increased.

Further, because the third contact plug V1 is above the shallow trench isolation STI, a distance between the third contact plug V1 and the hydrogen barrier film BRR on the side wall of the ferroelectric capacitor FC is larger than the conventional one. Thus, it is possible to prevent the third contact plug V1 from damaging the hydrogen barrier film BRR covering the side wall of the ferroelectric capacitor FC. This also leads to improvements in yield and reliability of the ferroelectric memory.

Meanwhile, when the distance between the third contact plug V1 and the ferroelectric capacitor FC is fixed at d2, the distance between two adjacent ferroelectric memories can be reduced. This means that the chip size of a ferroelectric memory can be reduced while substantially the same yield and reliability as the conventional ones are maintained.

The third contact plug V1 is above the shallow trench isolation STI and electrically connected via the first metallic interconnection M0s and the second contact plug CS to the diffusion layer 21 on the active area AA. Thus, the active area AA needs not to be processed in complicated shapes and can be formed linearly. This maintains the reliability of the ferroelectric memory.

When the active area AA is processed in a winding pattern as shown in FIG. 3B of Patent Document 3, for example, the silicon substrate must be processed. Processing silicon crystals is more difficult than processing other materials (such as polysilicon, oxidized film, and metallic film). Accordingly, to form the winding active area AA, the distance between adjacent active areas AA must be increased to keep the reliability, which may lead to an increase in chip size.

On the other hand, because the active area AA is formed in a linear shape in the first embodiment, the silicon substrate 10 is relatively easy to be processed. The distance between adjacent active areas AA can be reduced, and thus the reliability of the ferroelectric memory can be kept while reducing the chip size as compared to conventional cases.

Figure 4:
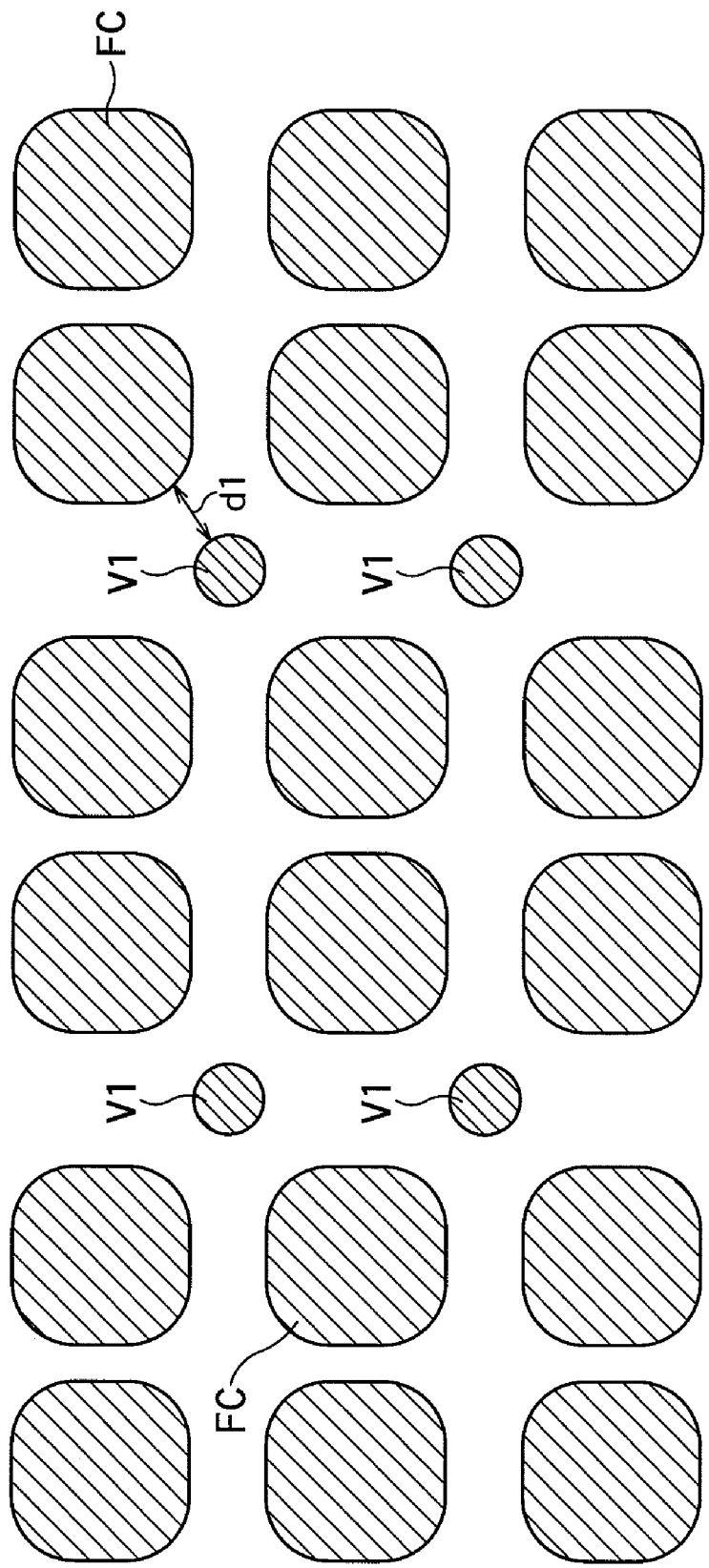
FIG. 4 shows a plane pattern after the third contact plug V1 and the ferroelectric capacitor FC are formed.

FIG. 4 shows a plane pattern after the third contact plug V1 and the ferroelectric capacitor FC are formed. Even if a mask layout is a square as shown in FIG. 2, corners are rounded in the actual pattern as shown in FIG. 4. The plane configuration of the third contact plug V1 is usually a substantial circle. Thus, the distance between the third contact plug V1 and the ferroelectric capacitor FC is further increased.

Conventionally, the distance d2 between the contact plug V1 and the ferroelectric capacitor FC is a distance between side surfaces of the contact plug V1 and the ferroelectric capacitor FC as shown in FIG. 2. Accordingly, even if the corners of the contact plug V1 and the ferroelectric capacitor FC are rounded, the distance d2 between them hardly changes.

On the other hand, according to the first embodiment, the distance d1 between the third contact plug V1 and the ferroelectric capacitor FC is a distance between a corner of the third contact plug V1 and a corner of the ferroelectric capacitor FC. When the layout of the ferroelectric capacitor FC and the third contact plug V1 is designed by taking rounded corners of the third contact plug V1 and the ferroelectric capacitor FC into consideration, the chip size can be further reduced.

When the distance between adjacent ferroelectric capacitors FC is reduced, the short circuit between the upper end of the first metallic interconnection M0s and the end of lower electrode LE of the ferroelectric capacitor FC may be concerned. The alignment of the ferroelectric capacitor FC during process is performed by using the first metallic interconnection M0s as a reference. The relative position between the first metallic interconnection M0s and the ferroelectric capacitor FC is thus relatively accurate. Accordingly, the possibility of the short circuit between the upper end of the first metallic interconnection M0s and the end of lower electrode LE of the ferroelectric capacitor FC is relatively low. On the other hand, the alignment of the contact plug V1 during process uses not the ferroelectric capacitor FC but the first metallic interconnection M0s as a reference. Thus, the possibility of the short circuit between the contact plug V1 and the end of lower electrode LE of the ferroelectric capacitor FC becomes relatively large. When the contact plug V1 is shifted from between ferroelectric capacitors FC to above the shallow trench isolation STI as in the first embodiment, the distance between ferroelectric capacitors FC adjacent to each other in a column direction DIR2 can be reduced while taking only the distance between the first metallic interconnection M0s and the lower electrode LE that the short circuit hardly occurs into consideration.

The ferroelectric memory according to the first embodiment can be obtained merely by changing the mask layouts of the first metallic interconnection M0s, the third contact plug V1, and the second metallic interconnection M1 in a known manufacturing method of ferroelectric memories.

Second Embodiment

Figure 5:
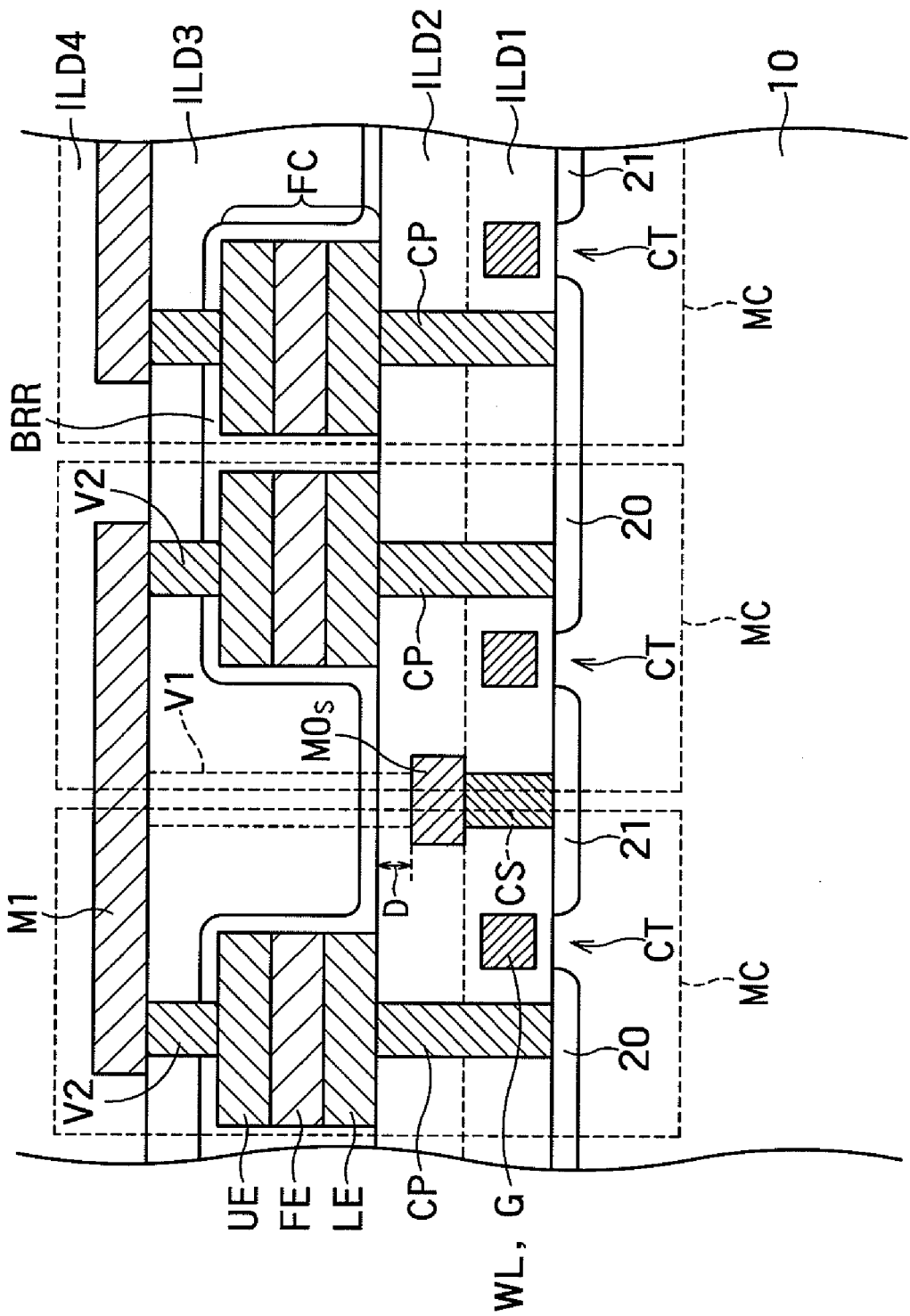
FIG. 5 is a cross-sectional view of a ferroelectric memory according to a second embodiment of the present invention.

FIG. 5 is a cross-sectional view of a ferroelectric memory according to a second embodiment of the present invention. The plan view of the ferroelectric memory according to the second embodiment can be the same as the plan view of FIG. 2. FIG. 5 corresponds to the cross-section along the line A-A shown in FIG. 2. The cross-sectional view along the line B-B of FIG. 2 is the same as the cross-sectional view of FIG. 3B.

According to the second embodiment, the metallic interconnection M0p is not provided under the lower electrode LE and the first contact plug CP connects between the lower electrode LE and the diffusion layer 20. The bottom surface of the lower electrode LE is placed at a higher level than the top surface of the metallic interconnection M0s with respect to the surface of the silicon substrate 10. The first contact plug CP is thus longer than that of the first embodiment. To place the bottom surface of the lower electrode LE at a higher level than the top surface of the metallic interconnection M0s, the second interlayer dielectric film ILD2 can be deposited thick so as to cover the top surface of the metallic interconnection M0s. Other configurations of the second embodiment can be identical to the corresponding configurations of the first embodiment.

Because the bottom surface of the lower electrode LE is placed at a higher level than the top surface of the metallic interconnection M0s by D, the short circuit between the first metallic interconnection M0s and the lower electrode LE can be avoided more reliably. Thus, the distance between ferroelectric capacitors FC adjacent to each other in the column direction DIR2 can be further reduced. The second embodiment can further achieve the effects of the first embodiment.

Modification Example of Second Embodiment

Figure 6:
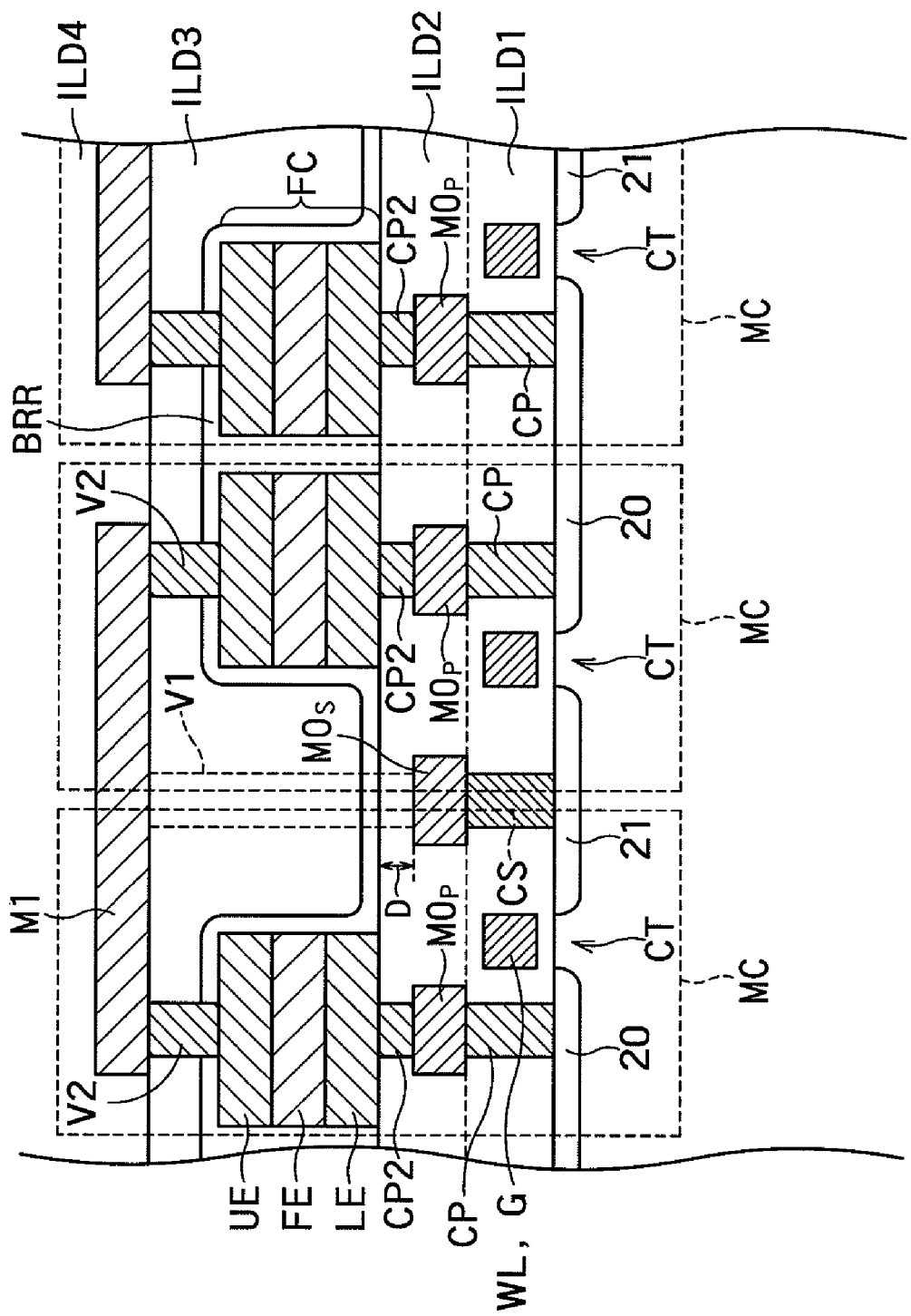
FIG. 6 is a cross-sectional view of a ferroelectric memory according to a modification example of the second embodiment.

FIG. 6 is a cross-sectional view of a ferroelectric memory according to a modification example of the second embodiment.

The metallic interconnection M0$p$ is provided below the lower electrode LE in this modification example. The metallic interconnection M0$p$ is on the same layer as M0$s$. The metallic interconnection M0$p$ is provided and the contact plug CP2 is provided on the metallic interconnection M0$p$. Thus, the bottom surface of the lower electrode LE can be at a higher level than the top surface of the metallic interconnection M0$s$. As a result, this modification example has identical effects as those of the second embodiment.

Third Embodiment

Figure 7:
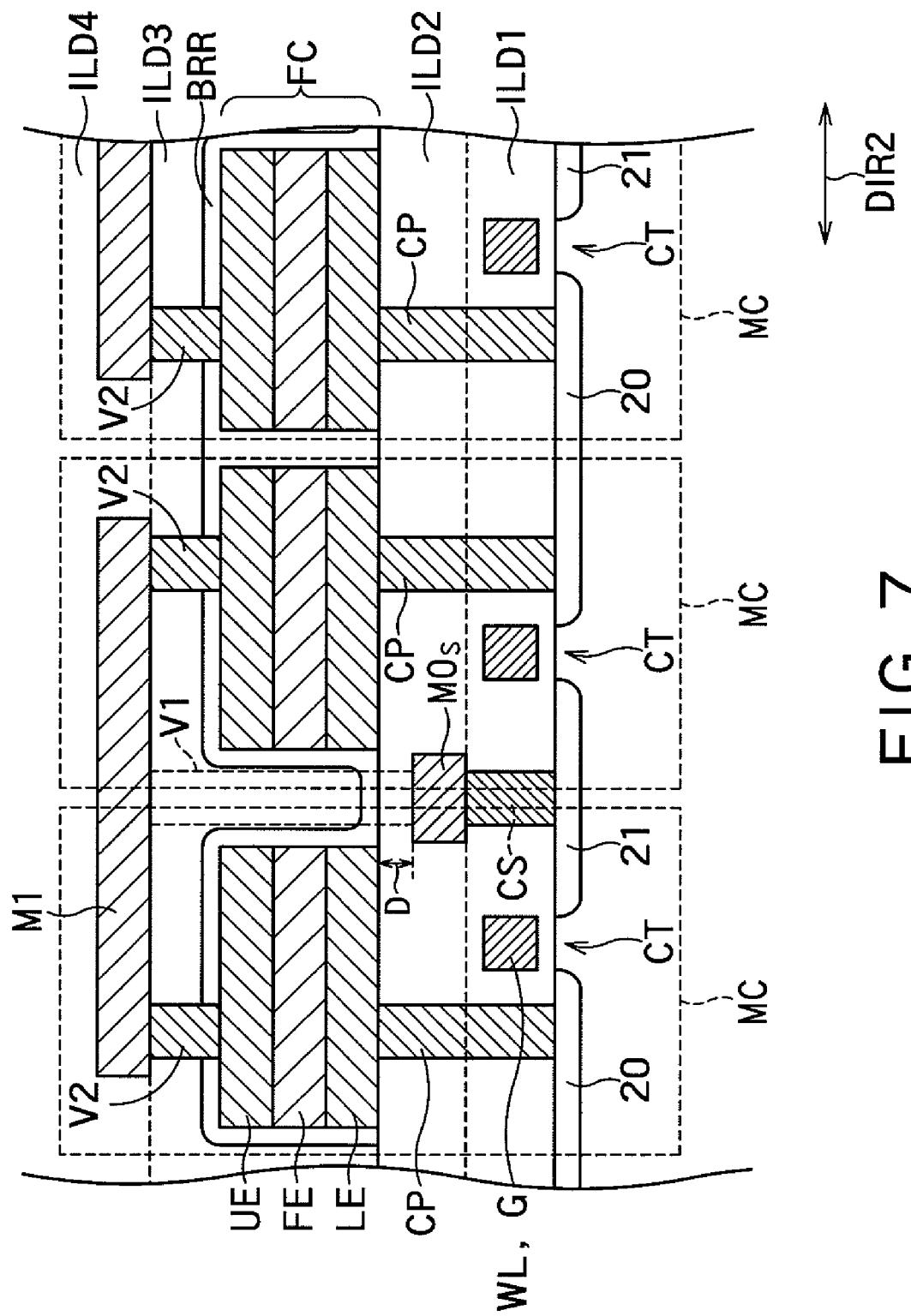
FIG. 7 is a cross-sectional view of a ferroelectric memory according to a third embodiment of the present invention.
Figure 8:
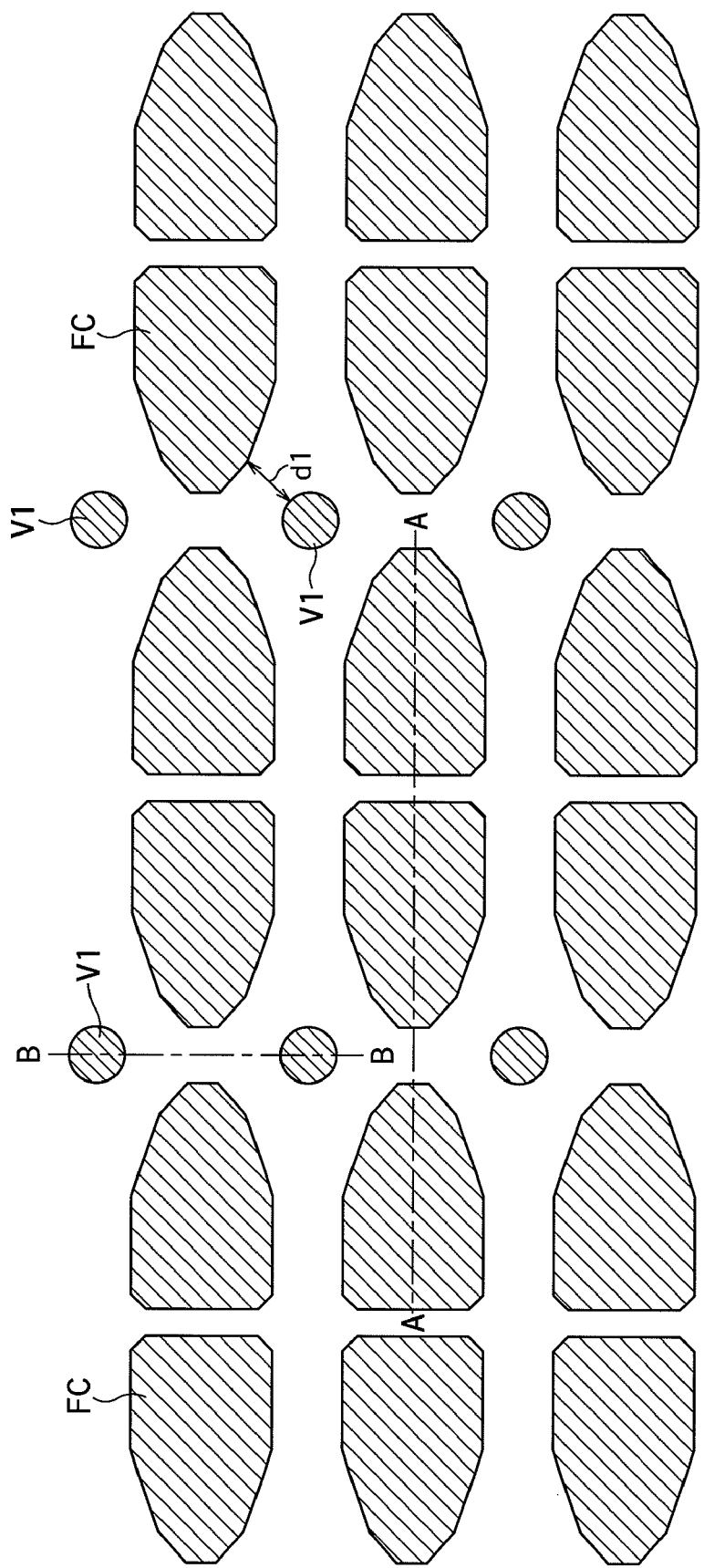
FIG. 8 is a plan view of the ferroelectric memory according to the third embodiment.

FIG. 7 is a cross-sectional view of a ferroelectric memory according to a third embodiment of the present invention. FIG. 8 is a plan view of the ferroelectric memory according to the third embodiment. FIG. 7 corresponds to the cross-section along a line A-A shown in FIG. 8. The cross-sectional view along a line B-B of FIG. 8 is the same as the cross-sectional view of FIG. 3B.

As shown in FIG. 8, the plane configuration of the ferroelectric capacitor FC is an elongated configuration with its longer diameter extending in the column direction DIR2 in the third embodiment. Thus, the area of the ferroelectric capacitor FC can be further increased while keeping the distance d1 between the ferroelectric capacitor FC and the contact plug V1. When the area of the ferroelectric capacitor FC becomes large, a large signal difference can be obtained during data detection. Consequently, false data detection can be suppressed.

Other configurations of the third embodiment can be identical to the corresponding configurations of the second embodiment. The bottom surface of the lower electrode LE is thus placed at a higher level than the top surface of the metallic interconnection M0$s$ by D. Even if the ferroelectric capacitor FC extends toward the metallic interconnection M0$s$, the short circuit between the ferroelectric capacitor FC and the metallic interconnection M0$s$ can be avoided as shown in FIG. 7. The third embodiment can further achieve the effects of the second embodiment.

Fourth Embodiment

Figure 9:
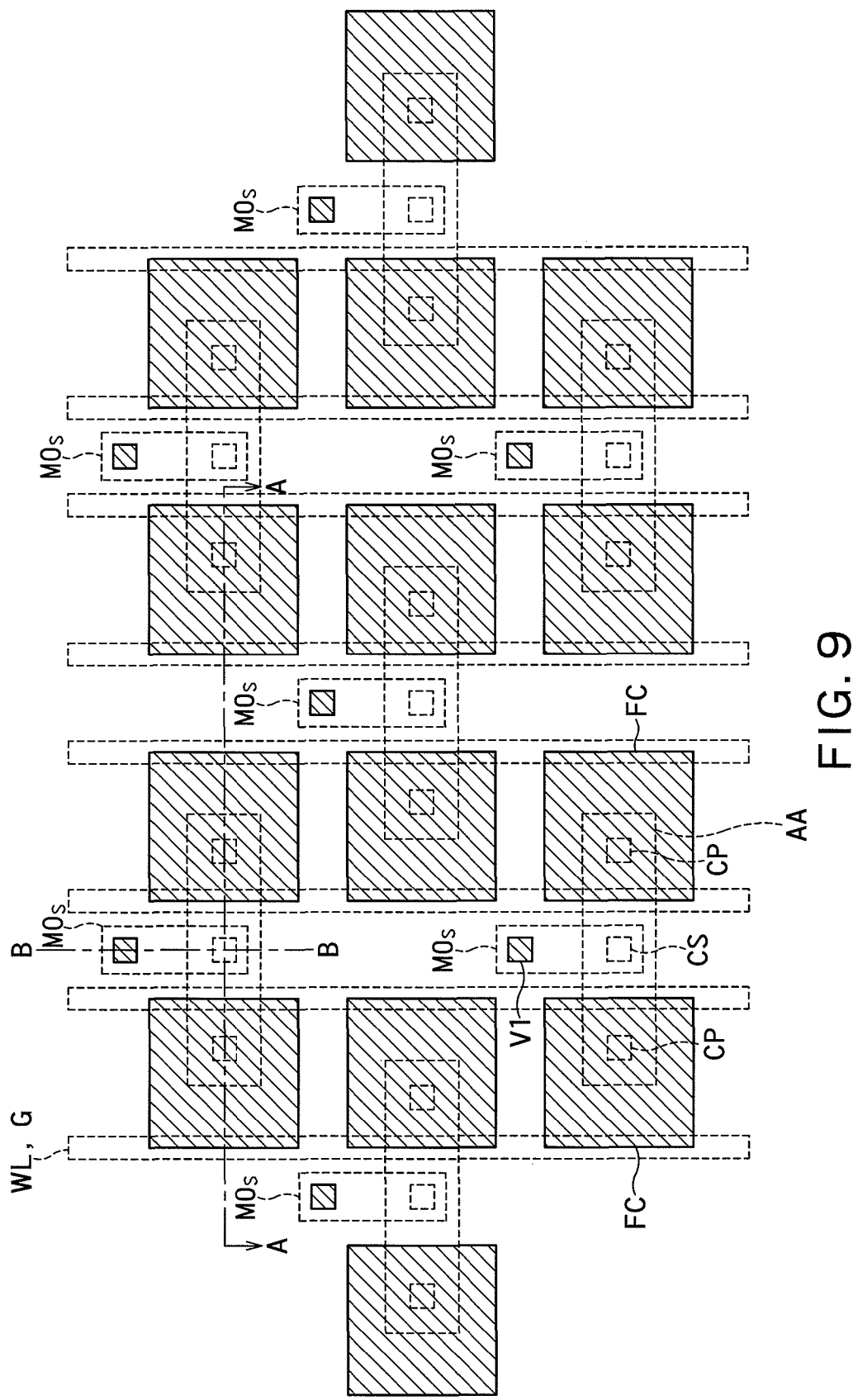
FIG. 9 is a schematic plan view of a ferroelectric memory according to a fourth embodiment of the present invention.
Figure 10B:
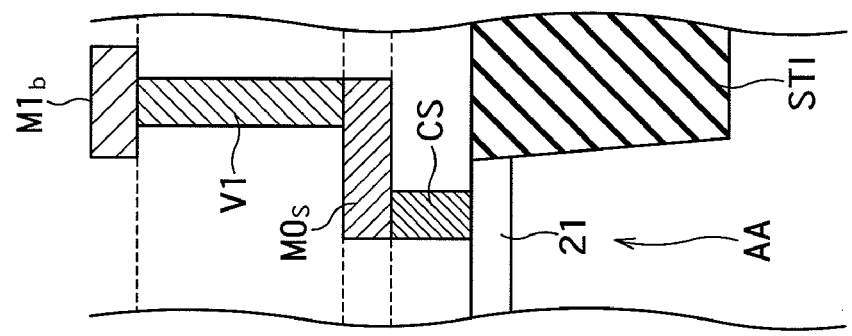
FIG. 10B is a cross-sectional view along a line B-B shown in FIG. 9.
Figure 10A:
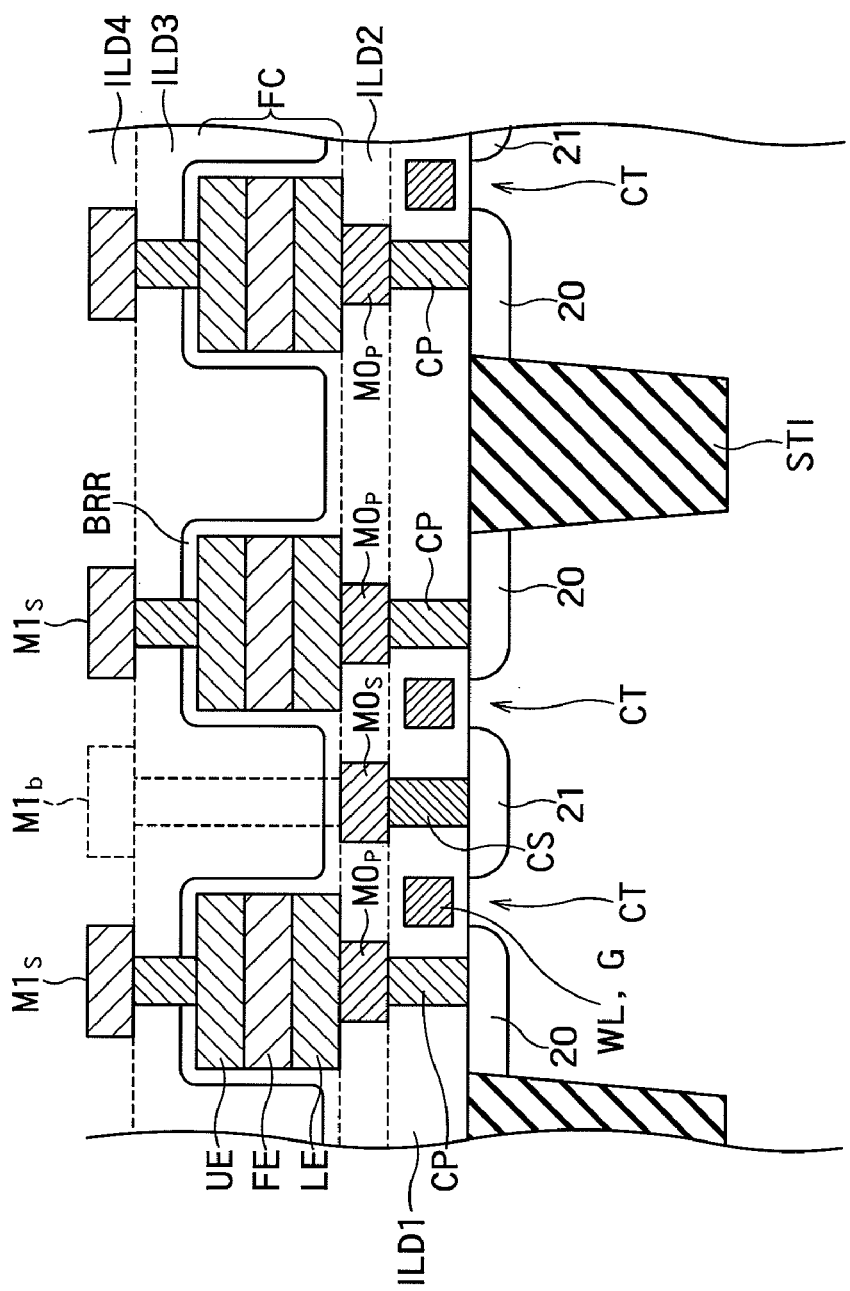
FIG. 10A is a cross-sectional view along a line A-A shown in FIG. 9.

FIG. 9 is a schematic plan view of a ferroelectric memory according to a fourth embodiment of the present invention. FIG. 10A is a cross-sectional view along a line A-A shown in FIG. 9. FIG. 10B is a cross-sectional view along a line B-B shown in FIG. 9.

The fourth embodiment is not a series connected TC unit type ferroelectric RAM but a conventional ferroelectric memory that each memory cell MC is connected between a source line and a bit line. For example, the upper electrode UE of the ferroelectric capacitor FC is electrically connected via a metallic interconnection M1$s$ to the source line (not shown) and the diffusion layer 21 is electrically connected via the contact plug V1 and a metallic interconnection M1$b$ to the bit line (not shown). Thus, the ferroelectric capacitor FC and the corresponding cell transistor CT are serially connected to each other between the source line and the bit line.

As shown in FIG. 9, a plurality of active areas AA are arranged two-dimensionally like islands in the fourth embodiment. Each active area AA is provided with two cell transistors CT and two ferroelectric capacitors FC. The shallow trench isolation STI is provided between the active areas AA. The fourth embodiment is the same as the above embodiments in that the contact plug V1 is provided not above the active area AA but above the shallow trench isolation STI.

As shown in FIG. 10A, two cell transistors CT in each active area AA share the diffusion layer 21 at the intermediate portion of the active area AA. The other diffusion layer 20 of the cell transistor CT is not shared by the other cell transistor CT.

In the fourth embodiment, the configurations of the second contact plug CS, the first metallic interconnection M0$s$, and the third contact plug V1 are identical to those of the first embodiment. The configurations of the connections between the ferroelectric capacitor FC and the diffusion layer 20 and between the ferroelectric capacitor FC and the metallic interconnection M1$s$ in the fourth embodiment can be identical to those in the first embodiment.

The metallic interconnection M1$s$ connected to the upper electrode UE is not electrically connected to the metallic interconnection M1$b$ connected to the contact plug V1. The metallic interconnections M1$s$ and M1$b$ are connected to, for example, the source line and the bit line, respectively.

Other configurations of the fourth embodiment can be identical to the corresponding configurations of the first embodiment. Therefore, the present invention can be applied to conventional ferroelectric memories such as the memory in the fourth embodiment. The fourth embodiment can achieve effects identical to those of the first embodiment. The fourth embodiment can be easily combined with the second or third embodiment. In the case of combining these embodiments, the fourth embodiment can achieve effects identical to those of the second or third embodiment.

The invention claimed is:

1. A semiconductor memory device comprising:
   a plurality of transistors on a semiconductor substrate;
   a first interlayer dielectric film on the transistors;
   a plurality of first contact plugs in the first interlayer dielectric film, each first contact plug connected to a first diffusion layer of one of the transistor transistors;
   a plurality of ferroelectric capacitors above the first contact plugs, each ferroelectric capacitor comprising a lower electrode, a ferroelectric film, and an upper electrode;
   a plurality of second contact plugs in the first interlayer dielectric film, each second contact plug being below an area between two adjacent ferroelectric capacitors and connected to a second diffusion layer of one of the transistors;
   a plurality of first interconnections connected to the second contact plugs, the first interconnections extending in a first direction substantially perpendicular to a direction of an alignment of the two adjacent ferroelectric capacitors on the first interlayer dielectric film;
   a second interlayer dielectric film above the first interlayer dielectric film and the first interconnections;
   a plurality of third contact plugs in the second interlayer dielectric film, the third contact plugs being respectively connected to the first interconnections at positions shifted in the first direction from the second contact plugs;
   a plurality of second interconnections configured to electrically connect the third contact plugs to upper electrodes of the two adjacent ferroelectric capacitors;
   linear active areas in a striped pattern on a surface of the semiconductor substrate; and
   shallow trenches between the active areas, wherein
   the transistors are in the active areas,
   the ferroelectric capacitors are above the active areas, the second contact plugs are connected to the first interconnections above the active areas, the first interconnections extend from the active areas toward the trenches, and the third contact plugs are connected to the first interconnections above the trenches.

2. The device of 1, wherein the third contact plugs are at an intermediate position between adjacent linear active areas.

3. The device of claim 1, wherein the third contact plugs are at a position with a substantially equal distance from four adjacent ferroelectric capacitors.

4. The device of claim 1 further comprising a barrier film on side surfaces of the ferroelectric capacitors.

5. The device of claim 1, wherein a bottom surface of a lower electrode of one the ferroelectric capacitors is at a higher level than a top surface of the first interconnections.

6. The device of claim 1, wherein a planar shape of the ferroelectric capacitors is elongated with a longer diameter extending in the direction of the alignment.

* * * * *